(12) United States Patent
Kim et al.

(10) Patent No.: US 9,980,044 B2
(45) Date of Patent: May 22, 2018

(54) BALANCE ADJUSTMENT CONTROL METHOD FOR SOUND/ILLUMINATION DEVICES

(71) Applicant: KSEEK CO., LTD., Daejeong (KR)

(72) Inventors: Young Real Kim, Daejeon (KR); Ju Sang Kim, Daejeon (KR)

(73) Assignee: KSEEK CO., LTD., Daejeon (KR)

( * ) Notice: Subject to any disclaimer, the term of this patent is extended or adjusted under 35 U.S.C. 154(b) by 0 days. days.

(21) Appl. No.: 15/117,422

(22) PCT Filed: May 13, 2014

(86) PCT No.: PCT/KR2014/004280
§ 371 (c)(1),
(2) Date: Aug. 8, 2016

(87) PCT Pub. No.: WO2015/126008
PCT Pub. Date: Aug. 27, 2015

(65) Prior Publication Data
US 2016/0381458 A1    Dec. 29, 2016

(30) Foreign Application Priority Data
Feb. 19, 2014    (KR) .......... 10-2014-0018962

(51) Int. Cl.
*H04R 3/04* (2006.01)
*H03G 3/30* (2006.01)
(Continued)

(52) U.S. Cl.
CPC .......... *H04R 3/04* (2013.01); *H03G 3/3005* (2013.01); *H04R 29/001* (2013.01);
(Continued)

(58) Field of Classification Search
None
See application file for complete search history.

(56) References Cited

U.S. PATENT DOCUMENTS

2004/0002781 A1* 1/2004 Johnson .............. H04R 3/04
700/94
2007/0035706 A1* 2/2007 Margulis ............. G03B 21/20
353/122
(Continued)

FOREIGN PATENT DOCUMENTS

JP    H07201205    8/1995
JP    2001118689   4/2001
(Continued)

*Primary Examiner* — Curtis Kuntz
*Assistant Examiner* — Kenny Truong
(74) *Attorney, Agent, or Firm* — IPLA P.A.; James E. Bame

(57) ABSTRACT

A balance adjustment control method for sound/illumination devices comprises: allowing, by the control terminal, basic data, in which multiple pieces of sample sound data for the sound devices or human voices or sample illumination data for each illumination device are stored, to be input, the basic data including at least one piece of information among size information, open information, device information, and audience information of the performance area; extracting at least one piece of sample sound data or sample illumination data; performing at least one scheme by the control terminal; and performing at least one scheme by the control terminal, among a scheme of generating a sound balance adjustment signal for each of the sound output devices by comparing the input sound data and the sample sound data, and then transmitting the generated signal to the control device.

14 Claims, 3 Drawing Sheets

(51) Int. Cl.
  *H04R 29/00* (2006.01)
  *H05B 37/02* (2006.01)
  *H05B 33/08* (2006.01)

(52) U.S. Cl.
  CPC ....... *H05B 33/0851* (2013.01); *H05B 37/029* (2013.01); *H05B 37/0227* (2013.01); *H05B 37/0272* (2013.01)

(56) References Cited

U.S. PATENT DOCUMENTS

| | | | | |
|---|---|---|---|---|
| 2007/0253561 | A1* | 11/2007 | Williams | H04S 7/301 381/58 |
| 2009/0022329 | A1* | 1/2009 | Mahowald | H03G 3/32 381/57 |
| 2010/0086162 | A1* | 4/2010 | Nielsen | H04R 1/323 381/333 |

FOREIGN PATENT DOCUMENTS

| | | |
|---|---|---|
| JP | 2002289365 | 10/2002 |
| KR | 20100000991 | 1/2010 |
| KR | 20110008494 | 1/2011 |

* cited by examiner

BALANCE ADJUSTMENT CONTROL METHOD FOR SOUND/ILLUMINATION DEVICES

BACKGROUND

The present invention relates to a balance adjustment control method for sound/illumination devices and, more specifically, to a balance adjustment control method for sound/illumination devices to automatically adjust balance among devices by using a control terminal which adjusts output levels of sound or illumination in a performance area including a plurality of sound output devices or a plurality of illumination deices.

In general, a stage control device serves to control various lighting and sound equipment, event equipment, or stage equipment installed on the stage of performance facilities and most of them have been controlled the stage equipment by using a console listed and installed by a large number switch devices.

In the conventional stage control device, one control module is connected to a plurality of stage equipment so as to analyze the control data transmitted from the control module, so that it selects the stage device capable of controlling through the IP address etc. to be controlled.

In such a stage control device, a sound technician or a lighting technician manually sets the balance value according to the stage status, so that the control module adjusts the balance of sound or lighting etc. or adjusts the balance of sound or lighting through a pre-set program.

Thus, there is a problem in that it requires the technicians and high-priced programs related to the sound effect or the lighting effect in order that the audiences feel the three-dimensional sound or the lighting effect.

In addition, the conventional stage control device has a problem in that it cannot adjust the balance between the stage devices through the existing program stored in the control module in consideration of the characteristics of the stage devices or the characteristics of the output result between each device.

Since such a stage control device uses the high-prices equipment and programs for applying to the directing area having a karaoke accompaniment device or a home theater, there is a problem that it cannot be actually applied to the small directing area.

Currently, with the development of a digital video system and a digital sound system, a home theater system is increasingly commercialized by the user's need to enjoy the three-dimensional surround sound, which is capable of experiencing at the theater, at home When it plays the stereo music, it is important to realize a three-dimensional effect of the sound. Besides, in the case of the home theater system, the viewer recognizes that the sound is generated from the image screen, so that the viewer can be immersed in the images. Accordingly, the localization for the image should be formed by controlling the location and the output of the speaker. In other words, it requires a combination of the sound of each speaker according to the images.

In order to satisfy the condition of this home theater systems, a variety of speaker systems have been developed. Presently, a DOLBY-PRO-LOGIC system manufactured by a DOLBY Laboratories is generally commercialized.

Various audio systems including the home theater systems are equipped with a center channel speaker, a woofer speaker, left/right speakers, and front left/right speakers so as to generate the surround sound effect. Thus, the balance of the intensity of the sound volume outputted from the left and right speakers is accurately adjusted around the listener, so that it can maximize the sound effects.

However, in the balance adjustment method of the audio system according to the conventional art, the listener manually adjusts the sound volume output level of the left and right speakers by using his hearing. Accordingly, there is a problem in that the general listeners wanting in professional skills cannot finely adjust the sound balance. In particular, there is a problem in that the sound balance of the audio equipment cannot be exactly adjusted around the video equipment in the audio/video system.

SUMMARY OF THE INVENTION

The present invention has been made in an effort to solve the problems of the conceptual description of the conventional art as described above, and an object of the present invention is to provide a balance adjustment control method for sound/illumination devices in that sample sound data or sample illumination data is transmitted to a performance area including various kinds of sound devices, sound output devices, and illumination devices, and then output data obtained by measuring output characteristics output from the devices is compared with the sample sound data or sample illumination data, to automatically adjust balance of each device.

According to one aspect of the present invention so as to accomplish these objects, there is provided to a balance adjustment control method for sound/illumination devices, which is performed by a control terminal performing a sound or illumination adjustment function with respect to a performance area where sound/illumination devices including at least one device of a plurality of sound devices, a plurality of sound output devices, a plurality of sound input devices, and a plurality of illumination devices are installed, the method including the steps of: extracting at least one sample sound data or sample illumination data corresponding to the performance area on the basis of basic data related to the performance area, and transmitting the extracted sample sound data or sample illumination data to a control device which controls operations of the sound/illumination devices; performing, by the control terminal, at least one manner of a manner of inputting output sound output from a plurality of the sound output devices when the sample sound data is output through a plurality of the sound output devices by the control device, or a manner of inputting input illumination data obtained by measuring illumination output states of the illumination devices when the sample illumination data is output through a plurality of the illumination devices by the control device, such that input sound data for the output sound or input illumination data for the illumination output states is input; and performing, by the control terminal, at least one manner of a manner of comparing the input sound data with the sample sound data to generate a sound balance adjustment signal for each of the sound output devices and then transmitting the sound balance adjustment signal to the control device, or a manner of comparing the input illumination data with the sample illumination data to generate an illumination balance adjustment signal for each of the illumination devices and then transmitting the illumination balance adjustment signal to the control device.

The method further includes a step of storing, by the control terminal, sample sound data related to sound or sample illumination data related to illumination, and storing and associating the sample sound data or the sample illumination data with basic data including at least one of size information, opening information, device information, and audience information of the performance area.

In the step of inputting, by the control terminal, the output sound output from a plurality of the sound output devices, an input device connected to the control terminal by wire or wireless communication receives the output sound of a plurality of the sound output devices and transmits the output sound to the control terminal.

In the step of inputting, by the control terminal, the input illumination data obtained by measuring illumination intensity of the illumination device, an input device connected to the control terminal by wire or wireless communication measures illumination output states of a plurality of the illumination devices and transmits the measured input illumination data to the control terminal.

The method further includes a step of repeatedly performing, by the control terminal, the sound balance adjustment function for each of the sound output devices and repeatedly performing the illumination balance adjustment function of each of the illumination devices to adjust an optimal output balance among the sound output devices or an optimal output balance among the illumination devices.

In the step of generating the sound balance adjustment signal and the step of generating the illumination balance adjustment signal, the maximum output sound or the maximum output illumination intensity is restricted by reflecting restriction policy information about light pollution or noise pollution.

In the step of generating the sound balance adjustment signal, noise in the performance area is measured in a state where there is no output of the sound/illumination devices, a type and magnitude of the measured noise are figured out, noise level information is calculated, and then the noise level information is reflected to generate the sound balance adjustment signal.

In the step of generating the sound balance adjustment signal, an interference degree according to the sound output among a plurality of the sound output devices or a difference between arrival times of sound outputs is measured, and the measured interference information is reflected to generate a sound balance adjustment signal for adjusting the output sound level or the output time of each sound output device.

In the step of generating the sound balance adjustment signal, when the control terminal includes a microphone or a sound sensor, the output sound levels output from a plurality of the sound output devices are detected by using the microphone or the sound sensor, and the detected output sound levels are compared with the sample sound data to generate the sound balance adjustment signal for adjusting the output levels and the output times of the sound output devices.

In the step of generating the illumination balance adjustment signal, indirect illumination or brightness information is measured in a state where the illumination devices in the performance area are turned off, and the measured indirect illumination or brightness information is reflected to generate the illumination balance adjustment signal for adjusting the output level of each illumination device.

In the step of generating the illumination balance adjustment signal, when the control terminal includes a camera or an illumination sensor, illumination output levels of a plurality of the illumination devices are detected through the camera or the illumination sensor, and the detected illumination output levels are compared with the sample illumination data to generate the illumination balance adjustment signal for adjusting the illumination output level and the output time of each illumination device.

In the step of generating the sound balance adjustment signal and the step of generating the illumination balance adjustment signal, when the control terminal includes a position sensor capable of measuring a distance, a distance from each sound output device and a distance from each illumination device are measured to calculate respective distance information, and the control terminal generates the sound balance adjustment signal for adjusting the output level of each sound device by using the distance information or generates the illumination balance adjustment signal for adjusting the output level of each illumination device by using the distance information.

When the sound output device or the illumination device is provided with rotation means and the rotation means can be rotated by the control of the control device, and when the control terminal includes a position sensor capable of measuring a distance, position information about the sound output devices or position information about the illumination devices is calculated, a position control signal for adjusting directions of the sound output devices or the illumination devices is generated on the basis of the position information and the sound balance adjustment signal or the illumination balance adjustment signal, and the generated position control signal is transmitted to the control device.

The control device receives the position control signal, transmits a rotation angle control signal of each sound output device to the rotation means of each sound output device in accordance with the position control signal to adjust the direction of each sound output device, and transmits a rotation angle control signal of each illumination device to the rotation means of each illumination device to adjust the direction of each illumination device.

The method further includes the steps of: transmitting, by the control terminal, a sound source input signal including sound data to the control device to correct a sound source of the sound input device; and receiving, by the control device, the sound source input signal to output the sound source to each sound input device, and inputting, by the control terminal, the sound source output to each sound input device, generating an input sound correction signal to correct an input sound level, and transmitting the input sound correction signal to the control device.

According to the balance adjustment control method of the present invention, the sample sound data or sample illumination data is transmitted to the performance area including various kinds of sound devices, sound output devices, and illumination devices by the control terminal, and then output data output from the devices is compared with the sample sound data or sample illumination data, so that it enables automatic execution of balance adjustment of each device, thereby making it unnecessary for a sound or illumination-related engineer to manually adjust the balance and enabling anyone to easily adjust the balance of sound or illumination using the control terminal.

Moreover, according to the balance adjustment control method of the present invention, a plurality of control devices for controlling devices in a performance area is unnecessary and only one control device capable of communicating with the control terminal is used. Therefore, the present invention can lower the device failure rate and prevent overload.

BRIEF DESCRIPTION OF DRAWINGS

The above and other objects, features and advantages of the present invention will be more apparent from the following detailed description taken in conjunction with the accompanying drawings, in which.

DETAILED DESCRIPTION OF THE INVENTION

Figure 1:
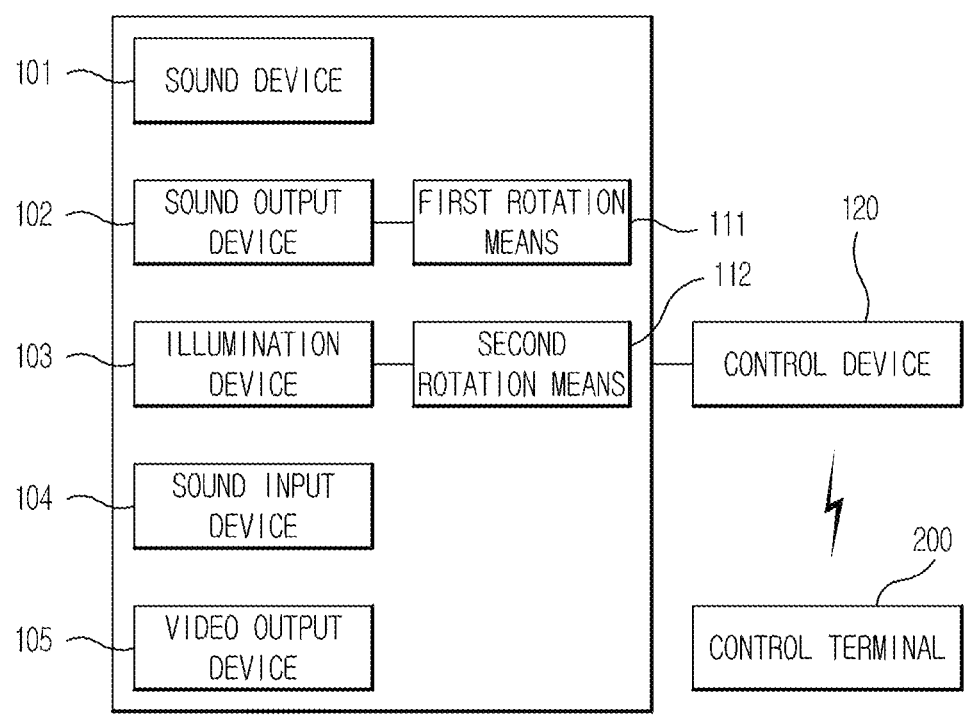
FIG. 1 is a diagram illustrating a configuration of a balance adjustment control system for sound/illumination devices according to an embodiment of the invention.

Since the description of the present invention is a mere embodiment for structural and functional description m, it must not be interpreted that the scope of the present invention is limited by the embodiments described in the text. That is, since the embodiments can be variously changed and have various forms, it should be understood that the scope of the invention includes the equivalents for realizing the technical concept. Also, since the specific embodiments do not include all objects and effects presented by the present invention, the scope of the present invention is not limited by them.

On the other hand, the meaning of the term described in the Present invention should be understood as follows.

Even though the terms such as 1, 2 , and others can be used to explain many components, the above components shall not be limited by the above terms. The above terms are used only to distinguish one component from the other component. For example, the first component can be named as the second component without departing from the scope of rights in this invention. Similarly, the second component can be named as the first component.

When it is mentioned to be "connected" or "linked" to the other component, a certain component may be connected or linked to the other component. However, it will be understood that there may be some other components between them. On the other hand, when it is mentioned to be directly "connected" or "linked" to the other component, a certain component will be understood that no other component exists between them. On the other hand, other expressions for describing the relationship between the components, that is "between ~" and "~ directly between", or "adjacent to ~" and "directly adjacent to ~" should be interpreted in like manner.

The singular expression includes plural expressions unless it is apparently different in the context. The terms such as "include", "equipped" or "have" in this application intend to designate that the feature, number, stage, movement, component, part or the combination described in the specification exist. Therefore, it will be Understood that the existence or the additional possibility of one or more than one different features, numbers, stages, actions, components, parts and the combination is not excluded in advance.

An identification codes (for example, a, b, c, etc.) are used for convenience of description and are not intended to show the order of identification code. If respective steps are obviously described as a particular sequence in context, it may occur differently with the specified order. That is, the respective steps may equally take place, may be substantially performed at the same time may take place, or may be performed in a reverse order.

Unless differently defined, all the terms used here including technical or scientific terms have the same meaning with what is generally understood by one who has common knowledge in the technical field that this invention belongs to. The terms such as those defined in the dictionary commonly used will be interpreted to have the meanings matching with the meanings in the context of the related technologies. Unless clearly defined in this application, they are not interpreted as ideal or excessively formal meanings.

Hereinafter, a preferred embodiment according to the present invention will be described in detail with reference to the accompanying drawings.

FIG. 1 is a diagram illustrating a configuration of a balance adjustment control system for sound/illumination devices according to an embodiment of the invention.

Referring to FIG. 1, the balance adjustment control system for sound/illumination devices includes a sound/illumination device 100, a control device 120, and a control terminal 200.

The sound/illumination device 100 includes a sound device 101, a sound output device 102, a sound input device 104, an illumination device 103 and a video output device 105, but is not limited thereto.

The sound device 101 includes a wind instrument, a stringed instrument, a percussion instrument, a piano, an electronic instrument, a karaoke machine, and the like, and the sound output device 102 includes a plurality of amplifiers, speakers, home theater speakers, and the like.

The sound input device 104 includes a plurality of microphones, sound source supply devices, and the like, and the illumination device 103 includes a LED illumination, a stage illumination incandescent lamp, and the like.

The video output device 105 includes a home theater which outputs video or sound, a computer, a display device, and the like. A display screen of such a video output device 105 may be included in the illumination device, and a sound device including a speaker may be included in the sound output device.

The control device 120 controls an operation of the sound/illumination device 100, and includes communication means for performing communication with the control terminal 200. Such a control device 120 allows sample sound data transmitted from the control terminal 200 to be output to the sound output device 102, and allows the output level of the sound output device 102 or the illumination device 103 to be adjusted in accordance with a sound balance adjustment signal or an illumination balance adjustment signal transmitted from the control terminal 200.

Herein, the balance may mean characteristics which can be achieved by output delay time setting or magnitude setting of the output and input designated in consideration of correlation among devices in a plurality of sound input devices 104, a plurality of sound output devices 102, or a plurality of illumination devices 103. In addition, the control device 120 can adjust output balance among a plurality of the sound output devices 102, output balance among a plurality of the illumination devices 103, and input balance among a plurality of the sound input devices 104.

In addition, the control device 120 may adjust the volume by correcting input sound levels of a plurality of the sound input devices 104 such as microphones in accordance with the balance adjustment signal of the control terminal 200, or may adjust screen brightness or an output sound level of the video output device 105. In addition, output times among devices may be adjusted by setting an output delay time of each device of the sound/illumination device 100.

The control terminal 200 can be connected to the control device 120 by wireless communication such as Wi-Fi and Ethernet. The control terminal 200 may be embodied by a mobile device, and may be a stage control device, a home theater, a karaoke accompaniment device, and a computer connected to a mobile device or other input devices by wire or wireless communication.

The mobile device measures an output state of the illumination device 103 or the sound output device 102, and transmits the measurement result to the control terminal 200. If the mobile device is the control terminal 200 itself, the control terminal 200 generates an illumination balance adjustment signal or a sound balance adjustment signal on the basis of basic data for a performance area and may output the signal to the control device 120 or may output the signal to each illumination device 103 or sound output device 102.

In this case, the control terminal 200 can automatically perform a sound or illumination balance adjustment function by executing a balance adjustment program after installing the balance adjustment program providing a process to automatically perform the balance adjustment control of the sound/illumination device. The balance adjustment program may be updated periodically or temporarily with sample sound data or data necessary for the other balance adjustment by a program provider.

The control terminal 200 accesses the program provider and can download the balance adjustment program through a network, and the program provider can apply a server, a database, a web technology, and the like.

As described above, the balance adjustment program may be provided in an application form, and the control terminal 200 may be stored in a memory in a firmware form.

In addition, the control terminal 200 generates a sound balance adjustment signal for adjusting an input level of the sound input device 104 such as a microphone or a sound device 101 such as an electronic instrument to adjust arrangements of each microphone or an input sound volume.

Figure 2:
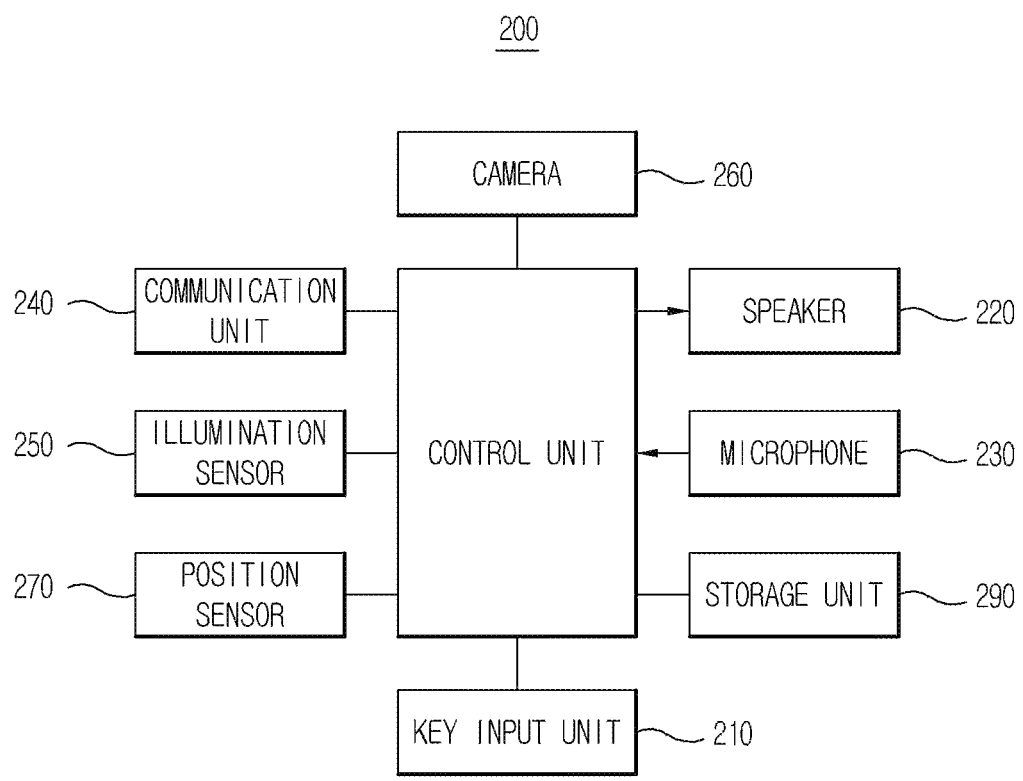
FIG. 2 is a block diagram illustrating a configuration of the control terminal illustrated in FIG. 1.

FIG. 2 is a block diagram illustrating a configuration of the control terminal illustrated in FIG. 1.

Referring to FIG. 2, when the mobile device is embodied as the control terminal 200, the control terminal 200 includes a key input unit 210, a speaker 220, a microphone 230, a communication unit 240, an illumination sensor 250, a camera 260, a position sensor 270, a control unit 280, and a storage unit 290.

To the key input unit 210, basic data including size information of a performance area, opening information for inside/outside, device information, and audience information can be input. In this case, the performance area may be an indoor or outdoor stage, a home, a karaoke, and may be a place where various sound-related devices are installed.

The speaker 220 outputs various kinds of sounds including sample sound data, and various kinds of sounds including output sound output from the sound output device 102 and the like can be input to the microphone 230.

The communication unit 240 can transmit and receive various signals through to and from the control device 120 by wireless communication.

The illumination sensor 250 measures illumination intensity, and can measure a visual effect degree including the illumination intensity by using the camera 260 when the control terminal 200 is not provided with the illumination sensor.

The position sensor 270 measures a distance from the illumination device 103, the sound output device 102, or the video output device 105, and may use an ultrasonic sensor, an infrared sensor, or the like.

The control unit 280 controls each of the speaker 220, the microphone 230, the communication unit 240, the illumination sensor 250, the camera 260, the position sensor 270, and the storage unit 290, to perform a sample sound data search function, a balance adjustment signal generation and transmission function, a position or direction calculation function, a position control signal generation and transmission function, and the like.

The storage unit 290 stores sample sound data about the sound device 101 including various instruments or human voice for each of man, woman, old, and young in a lookup table form, stores sample illumination data about each of various illumination devices in a lookup table form, stores basic data about the performance area, and stores various kinds of data necessary for balance adjustment.

Figure 3:
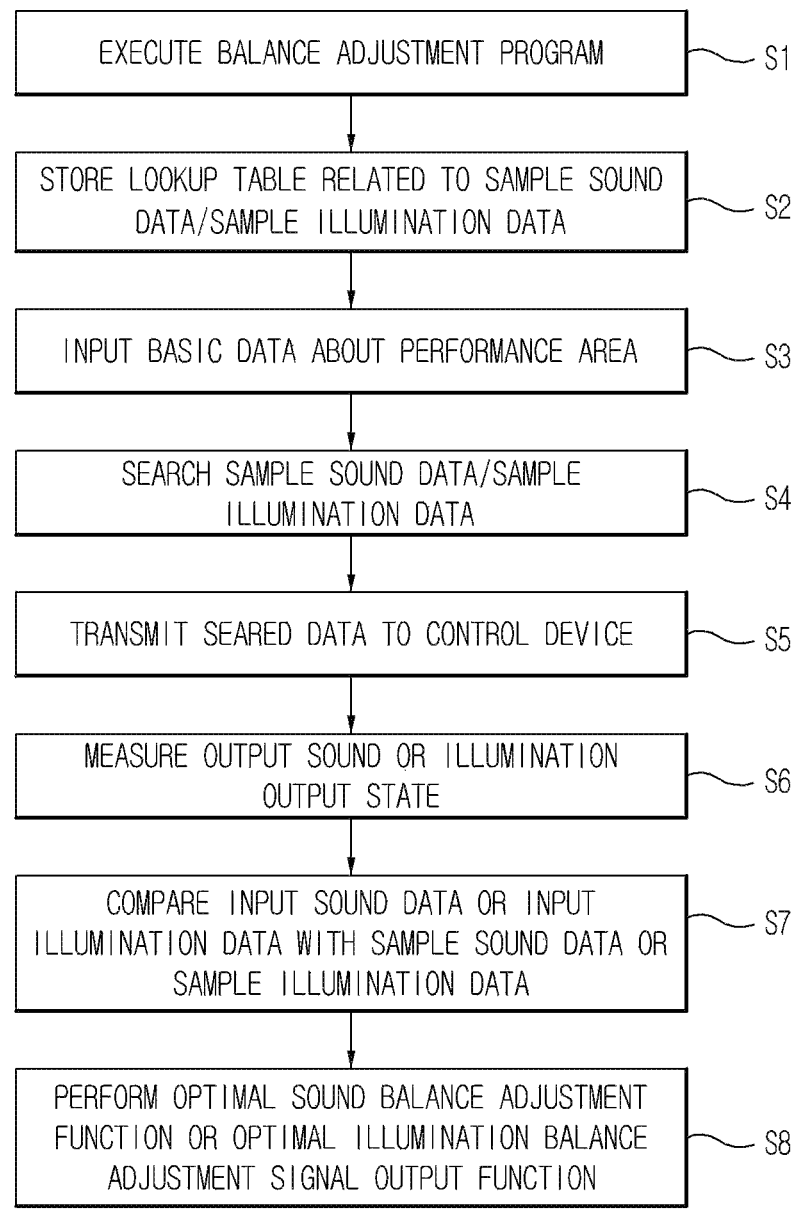
FIG. 3 is a flow chart illustrating the balance adjustment control method for sound/illumination devices according to an embodiment of the invention.

FIG. 3 is a flow chart illustrating the balance adjustment control method for sound/illumination devices according to an embodiment of the invention.

Referring to FIG. 3, according to the balance adjustment control method for sound/illumination devices, when the control terminal 200 is embodied by a mobile device, the control terminal 200 installs a balance adjustment program providing a process to automatically perform a balance adjustment control of the sound/illumination device 100, stores a lookup table for the sample sound data about human voice and the sound device 101 in the storage unit 290 by the balance adjustment program, and stores a lookup table for the sample illumination data for each of various illumination devices 103.

A user inputs basic data about the performance area such as a room in which a home theater is installed, a performance stage, and a karaoke, to the control terminal 200. The control terminal 200 searches at least one sample sound data and sample illumination data suitable for the performance area in the lookup table considering the sound/illumination device 100 disposed in the performance area, the size of the performance area, an opening/closing degree of the performance area, the number of audiences, available power magnitude, stage regulation, and the like on the basis of the basic data.

First, the control terminal 200 transmits the searched sample sound data to the control device 120, and the control device 120 allows the sample sound data to be output from the sound device 101 such as the electronic instrument and the speaker or the sound output device 102. In a case of transmitting a plurality of sample sound data to the control device 120, the control terminal 200 sequentially transmits the sample sound data at a predetermined time interval, thereby adjusting balance in a state where a mixing phenomenon or a noise phenomenon among the data is minimized. In addition, it is possible to adjust the balance considering mutual output characteristics among devices by transmitting the sample sound data together.

The control terminal 200 repeatedly performs the sound balance adjustment function for each sound output device 102 to adjust the optimal output balance among the sound output devices 102.

The control terminal 200 receives the output sound output from the sound device 101 or the sound output device 102, through the microphone 230 of the control terminal 200, compares the input sound data for the output sound input in such a manner with the sample sound data to generate a sound balance adjustment signal to which a difference between output sound and standard sound is reflected, and transmits the signal to the control device 120 or transmits the signal to each sound device 101 or each sound output device 102.

For example, the control terminal 200 detect a output sound level output from the speaker in the performance area through the microphone 230, and can generate and output the sound balance adjustment signal to adjust the volume of the speaker to the optimal state while comparing such a detected output sound level with the standard sound level. When a plurality of speakers are disposed in the performance area, the sound balance adjustment signal may perform adjustment of raising overall the output sound level by turning on at least one speaker or lowering overall the output sound level by turning off at least one speaker.

In this case, when the control terminal 200 transmits the sound balance adjustment signal to each sound device 101 or each sound output device 102, each sound device 101 or each sound output device 102 includes a communication function.

For example, when the performance area is an indoor concert stage, and when the size of the indoor concert stage, the number of acceptable audiences, device information, singer information, and the like are input, the control terminal 200 searches sample sound data for each device, and searches sample sound data of human voice considering sex, age, and the like of the singer.

Herein, the device information stored in the control terminal 200 includes at least one piece of information of a plurality of the sound output devices 102 and a plurality of the sound input devices 103. The device information stored in the control terminal 200 can advantageously act in performing more precise balance adjustment by the control terminal 200 as detailed information such as the number of devices, input and output characteristics, and information about position is further accompanied.

In addition, the device information may include information such as the kind and number of speakers, the kind and number of microphones, and the kind and number of accompaniment devices.

The control terminal 200 sequentially transmits the searched sample sound data to the control device 120, and the control device 120 allows each speaker or accompaniment device to output the sample sound data. The control terminal 200 inputs the output sound output from each speaker or accompaniment device, and then compares the output sound with the sample sound data to generate a sound balance adjustment signal.

In other words, the control terminal 200 generates the sound balance adjustment signal to lower the sound level when the output sound is larger than the sample sound data, and generates the sound balance adjustment signal to raise the sound level when the output sound is smaller than the sample sound data.

If a plurality of speakers is disposed in the performance area, the control terminal 200 generates the sound balance adjustment signal for each speaker to perform individual balance adjustment of each speaker.

In addition, the control terminal 200 acquires a measurement time of the output sound after transmitting the sample sound, compares a difference of measurement times of the output sound among the sound output devices 102, and designates an output delay time of each sound output device 102, thereby performing the balance adjustment.

Meanwhile, the control terminal 200 can restrict the maximum output sound by reflecting restriction policy information about noise pollution. In addition, the control terminal 200 measures noise in the performance area in a state where there is no output of all the sound device 101 and sound output device 102 in the performance area, figures out the type and magnitude of the measured noise, calculates noise level information, and can generate the sound balance adjustment signal by reflecting the noise level information.

In addition, the control terminal 200 measures an interference degree according to the sound output among a plurality of the sound output devices 102, and can generate the sound balance adjustment signal for adjusting the output sound level of each sound output device 102 by reflecting the measured interference information.

Overall, the control terminal 200 sums the noise level information and the interference information to the output sound for the sample sound data of the sound output device 102, compares the sum with the sample sound data, and can generate the optimal sound balance adjustment signal within the restriction information of the maximum output sound.

Meanwhile, the control terminal 200 finds the sample illumination data suitable for the illumination device in the performance area on the basis of the basic data, and transmits the sample illumination data to the control device 120, and the control device 120 controls the illumination device 103 to output the illumination state corresponding to the sample illumination data.

Herein, the device information stored in the control terminal 200 includes information about a plurality of the illumination devices 103. The device information stored in the control terminal 200 can advantageously act in performing more precise balance adjustment by the control terminal 200 as detailed information such as the number of illumination devices 103, illumination output characteristics, and information about position is further accompanied.

The control terminal 200 measures an illumination output state of the illumination device 103 by using the illumination sensor 250 or the camera 260, compares the sample illumination data with the input illumination data in the measured illumination output state, generates an illumination balance adjustment signal to adjust the output level of each illumination device 103 to be raised or lowered in accordance with a difference value between two illumination intensities, and transmits the illumination balance adjustment signal to the control device 120 or each illumination device 103.

In the illumination device 103, illumination output states such as a signal value of illumination, an intensity value, an output signal form, an operation time difference, a color, and blinking can be adjusted by the illumination balance adjustment signal.

Meanwhile, the control terminal 200 can restrict the maximum output illumination intensity by reflecting restriction policy information about light pollution, measures ambient indirect illumination or brightness information in a state where the illumination devices 103 in the performance area are turned off, and the measured indirect illumination or brightness information is reflected, and can generate an illumination balance adjustment signal for adjusting the output level of each illumination device 103.

A balance adjustment control method for sound/illumination devices according to another embodiment of the invention can perform an operation of correcting input sound for a plurality of sound input devices 104 such as microphones in the control terminal 200.

In other words, the control terminal 200 transmits a sound source input signal to the control device 120 in order to receive a sound source of the sound input device 104, and the control device 120 receives the sound source input signal and allows the sound source to be output for each sound input device 104. In this case, the sound source input signal may be sample sound data, and specific sound data.

The control terminal 200 inputs the sound source output for each sound input device 104, compares difference between the sound source input signal and the sound, then generates an input sound correction signal for lowering or raising the input sound level of the sound input device 104, and transmits the input sound correction signal to the control device 120.

Referring to FIG. 1 again, in the balance adjustment control method for sound/illumination devices according to another embodiment of the invention, the sound output device 102 is provided with first rotation means 111, and the illumination device 103 is provided with second rotation means 112. The first rotation means 111 and the second rotation means 112 may be configured by step motors or the like, and rotate the sound output device 102 and the illumination device 103 within a predetermined angle range.

In this case, the sound output device 102 may be a speaker, and the first rotation means 111 is installed for each speaker. In addition, the illumination device 103 may be a stage lighting fixture, a LED lamp, or the like, and the second rotation means 112 is installed in a frame fixing each lighting fixture and the like.

The control terminal 200 calculates distance and direction information of the sound output device 102 and the illumination device 103 through the position sensor 270. The control terminal 200 generates a position control signal considering a sound orientation angle on the basis of the distance and direction information of each sound output device 102 and the sound balance adjustment signal, and transmits the position control signal to the control device 120.

The control device 120 receives the position control signal, analyzes the position control signal to calculate a rotation direction and a rotation angle of each sound output device 102, then generates a rotation control signal including the rotation direction and rotation angle information, and transmits the rotation angle control signal to the first rotation means 111. Then, the first rotation means 111 rotates the sound output device 102 in accordance with the set rotation direction and rotation angle.

In addition, the control terminal 200 generates a position control signal considering directionality of illumination on the basis of the distance and direction information of each illumination device 103 and the illumination balance adjustment signal, and transmits the position control signal to the control device 120.

The control device 120 receives the position control signal, analyzes the position control signal to calculate a rotation direction and a rotation angle of each illumination device 103, then generates a rotation angle control signal including the rotation direction and rotation angle information, and transmits the rotation angle control signal to the second rotation means 112, and the second rotation means 112 rotates the illumination device 103 in accordance with the set rotation direction and rotation angle.

The balance adjustment control method for sound/illumination devices according to the embodiment of the invention can perform the sound balance or illumination balance adjustment function and similarly a balance adjustment function for the visual effect or sound effect of the video output device 105, and a user can direct sound, illumination, or special effects in accordance with scenario stored in advance.

The control terminal 200 is embodied by a mobile device, performs a function of adjusting the balance of the sound/illumination device 100, and thus a separate input device is not necessary between the control terminal 200 and the control device 120. However, when the control terminal 200 is any one device of the sound/illumination devices 100 or is embodied by a separated device, a mobile device or an input device capable of processing data about output sound or illumination output states is necessary between the control terminal 200 and the control device 120.

It is preferable that the control terminal 200 repeatedly performs the balance adjustment process for each device in order to achieve overall balance adjustment for a plurality of devices as targets of balance adjustment.

While the present invention has been described with respect to the specific embodiments, it will be apparent to those skilled in the art that various changes and modifications may be made without departing from the spirit and scope of the present invention as defined in the following claims.

The invention claimed is:

1. A balance adjustment control method for sound/illumination devices, which is performed by a control terminal performing a sound or illumination adjustment function with respect to a performance area where sound/illumination devices including at least one device of a plurality of sound devices, a plurality of sound output devices, a plurality of sound input devices, and a plurality of illumination devices are installed, the method comprising the steps of: extracting at least one sample sound data or sample illumination data corresponding to the performance area on the basis of basic data related to the performance area, and transmitting the extracted sample sound data or sample illumination data to a control device which controls operations of the sound/illumination devices;

performing, by the control terminal, at least one manner of a manner of inputting output sound output from a plurality of the sound output devices when the sample sound data is output through a plurality of the sound output devices by the control device, or a manner of inputting input illumination data obtained by measuring illumination output states of the illumination devices when the sample illumination data is output through a plurality of the illumination devices by the control device, such that input sound data for the output sound or input illumination data for the illumination output states is input; and performing, by the control terminal, at least one manner of a manner of comparing the input sound data with the sample sound data to generate a sound balance adjustment signal for each of the sound output devices and then transmitting the sound balance adjustment signal to the control device, or a manner of comparing the input illumination data with the sample illumination data to generate an illumination balance adjustment signal for each of the illumination devices and then transmitting the illumination balance adjustment signal to the control device, wherein in the step of generating the sound balance adjustment signal and the step of generating the illumination balance adjustment signal, when the control terminal includes a position sensor capable of measuring a distance, each distance between the sound output devices and each distance between the illumination devices are measured to calculate respective distance information, and the control terminal generates the sound balance adjustment signal for adjusting the output level of each sound device by using the distance information or generates the illumination balance adjustment signal for adjusting the output level of each illumination device by using the distance information.

2. The balance adjustment control method for sound/illumination devices according to claim 1, further comprising a step of storing, by the control terminal, sample sound data related to sound or sample illumination data related to illumination, and storing and associating the sample sound data or the sample illumination data with basic data including at least one of size information, opening information, device information, and audience information of the performance area.

3. The balance adjustment control method for sound/illumination devices according to claim 1, wherein in the step of inputting, by the control terminal, the output sound output from a plurality of the sound output devices, an input device connected to the control terminal by wire or wireless communication receives the output sound of a plurality of the sound output devices and transmits the output sound to the control terminal.

4. The balance adjustment control method for sound/illumination devices according to claim 1, wherein in the step of inputting, by the control terminal, the input illumination data obtained by measuring illumination intensity of the illumination device, an input device connected to the control terminal by wire or wireless communication measures illumination output states of a plurality of the illumination devices and transmits the measured input illumination data to the control terminal.

5. The balance adjustment control method for sound/illumination devices according to claim 1, further comprising a step of repeatedly performing, by the control terminal, the sound balance adjustment function for each of the sound output devices and repeatedly performing the illumination balance adjustment function of each of the illumination devices to adjust an optimal output balance among the sound output devices or an optimal output balance among the illumination devices.

6. The balance adjustment control method for sound/illumination devices according to claim 1, wherein in the step of generating the sound balance adjustment signal and the step of generating the illumination balance adjustment signal, the maximum output sound or the maximum output illumination intensity is restricted by reflecting restriction policy information about light pollution or noise pollution.

7. The balance adjustment control method for sound/illumination devices according to claim 1, wherein in the step of generating the sound balance adjustment signal, noise in the performance area is measured in a state where there is no output of the sound/illumination devices, a type and magnitude of the measured noise are figured out, noise level information is calculated, and then the noise level information is reflected to generate the sound balance adjustment signal.

8. The balance adjustment control method for sound/illumination devices according to claim 1, wherein in the step of generating the sound balance adjustment signal, an interference degree according to the sound output among a plurality of the sound output devices or a difference between arrival times of sound outputs is measured, and the measured interference information is reflected to generate a sound balance adjustment signal for adjusting the output sound level or the output time of each sound output device.

9. The balance adjustment control method for sound/illumination devices according to claim 1, wherein in the step of generating the sound balance adjustment signal, when the control terminal includes a microphone or a sound sensor, the output sound levels output from a plurality of the sound output devices are detected by using the microphone or the sound sensor, and the detected output sound levels are compared with the sample sound data to generate the sound balance adjustment signal for adjusting the output levels and the output times of the sound output devices.

10. The balance adjustment control method for sound/illumination devices according to claim 1, wherein in the step of generating the illumination balance adjustment signal, indirect illumination or brightness information is measured in a state where the illumination devices in the performance area are turned off, and the measured indirect illumination or brightness information is reflected to generate the illumination balance adjustment signal for adjusting the output level of each illumination device.

11. The balance adjustment control method for sound/illumination devices according to claim 1, wherein in the step of generating the illumination balance adjustment signal, when the control terminal includes a camera or an illumination sensor, illumination output levels of a plurality of the illumination devices are detected through the camera or the illumination sensor, and the detected illumination output levels are compared with the sample illumination data to generate the illumination balance adjustment signal for adjusting the illumination output level and the output time of each illumination device.

12. The balance adjustment control method for sound/illumination devices according to claim 1, wherein when the sound output device or the illumination device is provided with rotation means and the rotation means can be rotated by the control of the control device, and when the control terminal includes a position sensor capable of measuring a distance, position information about the sound output devices or position information about the illumination devices is calculated, a position control signal for adjusting directions of the sound output devices or the illumination devices is generated on the basis of the position information and the sound balance adjustment signal or the illumination balance adjustment signal, and the generated position control signal is transmitted to the control device.

13. The balance adjustment control method for sound/illumination devices according to claim 12, wherein the control device receives the position control signal, transmits a rotation angle control signal of each sound output device to the rotation means of each sound output device in accordance with the position control signal to adjust the direction of each sound output device, and transmits a rotation angle control signal of each illumination device to the rotation means of each illumination device to adjust the direction of each illumination device.

14. The balance adjustment control method for sound/illumination devices according to claim 1, further comprising the steps of: transmitting, by the control terminal, a sound source input signal including sound data to the control device to correct a sound source of the sound input device; and receiving, by the control device, the sound source input signal to output the sound source to each sound input device, and inputting, by the control terminal, the sound source output to each sound input device, generating an input sound correction signal to correct an input sound level, and transmitting the input sound correction signal to the control device.

* * * * *